United States Patent
Chen et al.

(10) Patent No.: US 10,748,899 B2
(45) Date of Patent: Aug. 18, 2020

(54) EPITAXIAL SOURCE AND DRAIN STRUCTURES FOR HIGH VOLTAGE DEVICES

(71) Applicant: Taiwan Semiconductor Manufacturing Co., Ltd., Hsin-Chu (TW)

(72) Inventors: Yi-Huan Chen, Hsin Chu (TW); Chien-Chih Chou, New Taipei (TW); Kong-Beng Thei, Pao-Shan Village (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/715,541

(22) Filed: Sep. 26, 2017

(65) Prior Publication Data

US 2019/0096887 A1    Mar. 28, 2019

(51) Int. Cl.
| | | |
|---|---|---|
| *H01L 27/092* | (2006.01) | |
| *H01L 21/8238* | (2006.01) | |
| *H01L 29/10* | (2006.01) | |
| *H01L 29/08* | (2006.01) | |
| *H01L 29/78* | (2006.01) | |
| *H01L 29/06* | (2006.01) | |

(52) U.S. Cl.
CPC .... *H01L 27/092* (2013.01); *H01L 21/823807* (2013.01); *H01L 21/823814* (2013.01); *H01L 29/0653* (2013.01); *H01L 29/0847* (2013.01); *H01L 29/1041* (2013.01); *H01L 29/78* (2013.01); *H01L 21/823892* (2013.01); *H01L 27/0922* (2013.01)

(58) Field of Classification Search
CPC ............ H01L 27/0922; H01L 29/1033; H01L 27/0925
USPC .......................................................... 257/371
See application file for complete search history.

(56) References Cited

U.S. PATENT DOCUMENTS

| | | | | |
|---|---|---|---|---|
| 2007/0034956 A1* | 2/2007 | Lee | ...................... | H01L 27/0262 257/355 |
| 2007/0221964 A1* | 9/2007 | Amos | ............... | H01L 21/28097 257/288 |
| 2008/0073745 A1* | 3/2008 | Tang | ...................... | H01L 21/84 257/500 |
| 2008/0248623 A1* | 10/2008 | Tsai | ................ | H01L 21/823493 438/276 |
| 2011/0008944 A1 | 1/2011 | Su et al. | | |
| 2014/0264599 A1 | 9/2014 | Chen et al. | | |

(Continued)

*Primary Examiner* — Marcos D. Pizarro
*Assistant Examiner* — Sue Tang
(74) *Attorney, Agent, or Firm* — Eschweiler & Potashnik, LLC

(57) ABSTRACT

An integrated circuit having an epitaxial source and drain, which reduces gate burnout and increases switching speed so that is suitable for high voltage applications, is provided. The integrated circuit includes a semiconductor substrate having a high voltage N-well (HVNW) and a high voltage P-well (HVPW). The integrated circuit further includes a high-voltage device on the semiconductor substrate. The high-voltage device includes an epitaxial p-type source disposed in the HVNW, an epitaxial p-type drain disposed in the HVPW, and a gate arranged between the epitaxial p-type source and the epitaxial p-type drain on a surface of the semiconductor substrate.

20 Claims, 7 Drawing Sheets

(56) References Cited

U.S. PATENT DOCUMENTS

2016/0056232 A1 2/2016 Kuo et al.
2016/0190249 A1* 6/2016 Hsieh .................. H01L 29/0847
　　　　　　　　　　　　　　　　　　　　　　257/51

* cited by examiner

EPITAXIAL SOURCE AND DRAIN STRUCTURES FOR HIGH VOLTAGE DEVICES

BACKGROUND

Modern day integrated chips use a wide range of devices to achieve varying functionalities. In general, integrated chips comprise active devices and passive devices. Active devices include transistors such as metal oxide semiconductor field effect transistors (MOSFETs). MOSFET devices are employed in applications such as automobile electrical systems, power supplies, and power management applications based on the switching speed of the MOSFET devices. Switching speed is based, at least in part, on the RDS(on) of the MOSFET device. RDS(on) stands for "drain-source on resistance," or the total resistance between the drain and source in a MOSFET when the MOSFET is "on." RDS(on) is associated with current loss and is the basis for a maximum current rating of the MOSFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
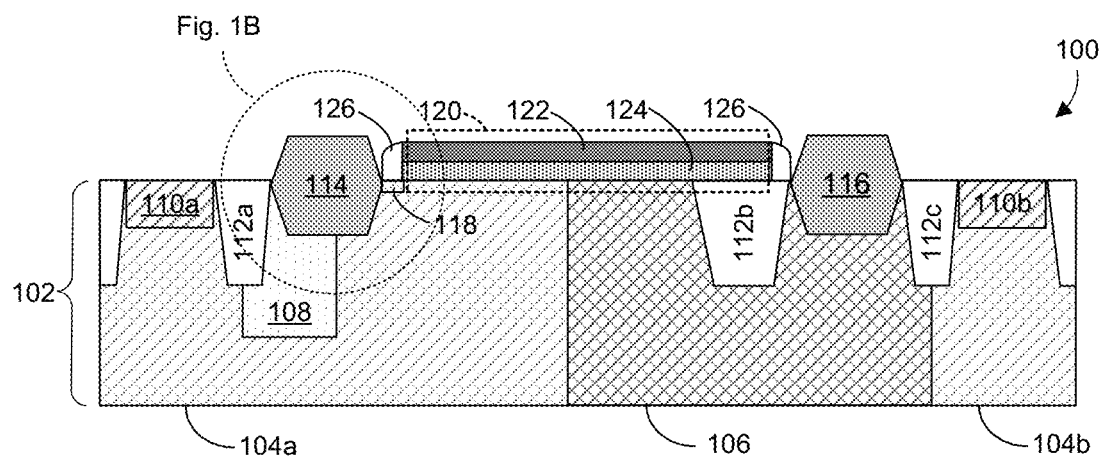
FIG. 1A illustrates a cross-sectional view of some embodiments of a P-type metal oxide semiconductor (PMOS) having an epitaxial source and drain.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an etch, a dielectric layer, or a substrate) may be referred to as a "first" element in some embodiments, the element may be referred to as a "second" element in other embodiments.

High-voltage devices are used in a wide range of applications including power management, telecommunications, etc. because of their increased switching speeds. However, undesirable effects, such as high RDS(on), result in reduced switching speeds and more energy loss during switching. A lower RDS(on) is desirable to avoid current loss and achieve a higher maximum current rating appropriate to the associated device. For example, because a high voltage device requires a higher maximum current rating, a lower RDS(on) is desirable.

Devices, such as high voltage devices, may include transistors having a source and drain separated by a gate. The source and drain are typically formed by implanting impurities in the substrate. However, the implantation process can damage the surface of the substrate at the source and drain. The defects in the substrate can negatively affect operation, for example, by raising the RDS(on). Here, rather than implanting impurities in the substrate to form a source and drain, the source and drain are epitaxially grown. Because the source and drain are grown, the surfaces of the source and drain do not suffer the defects that ion implantation causes. Accordingly, an epitaxial source and drain for high voltage devices is described to reduce RDS(on). Moreover, the doping density of the source and drain can be increased through epitaxial growth, which also reduces RDS(on).

With reference to FIG. 1A, a cross-sectional view of some embodiments of a P-type metal oxide semiconductor (PMOS) transistor 100 having epitaxial p-type source and drain are illustrated. The PMOS transistor 100 includes a semiconductor substrate 102. The substrate 102 has N-well regions including a first N-well region 104a and a second N-well region 104b. In some embodiments, the N-well regions 104a, 104b are high-voltage N-wells (HVNWs). The N-well regions 104a, 104b have an N-type dopant and may have a doping concentration ranging between about $10^{15}$ and $10^{17}$ impurities/cm$^{-3}$. The substrate 102 also includes a P-well region 106. In some embodiments, the P-well region 106 is a high-voltage P-well (HVPW). The P-well region 106 is arranged between the first N-well region 104a and the second N-well region 104b. The P-well region 106 has a P-type dopant and may have a doping concentration ranging between about $10^{15}$ and $10^{17}$ impurities/cm$^{-3}$.

An isolated P-well 108 is implanted in the first N-well region 104a. In some embodiments, the isolated P-well 108 has a P-type dopant and may have a doping concentration ranging between about $10^{16}$ and $10^{18}$ impurities/cm$^3$. The isolated P-well 108 extends into the first N-well region 104a from the uppermost surface of the substrate 102.

The N-well regions 104a, 104b also include N+ doped regions 110a, 110b. For example, a first N+ doped region 110a is implanted in the first N-well region 104a and a second N+ doped region 110b is implanted in the second N-well region 104b. The N+ doped regions 110a, 110b function as body contacts to the N-well regions 104a, 104b. The N+ doped regions 110a, 110b may be doped with higher concentration of N-type dopants (such as boron) than that of the N-well regions 104a, 104b so that the N+ doped regions act as contacts to the N-well regions 104a, 104b.

A plurality of isolation structures 112a, 112b, 112c define areas for various active features and isolate them from each other. The plurality of isolation structures 112a, 112b, 112c may include a first isolation structure 112a, a second isolation structure 112b, and a third isolation structure 112c. The plurality of isolation structures 112a, 112b, 112c may be, for example, shallow trench isolation structures, deep trench isolation structures, or some other type of isolation structures, and for example, may be filled with a dielectric material, such as silicon dioxide, for example.

An epitaxial p-type source 114 is disposed in the first N-well region 104a and an epitaxial p-type drain 116 is disposed in the P-well region 106. The epitaxial p-type source 114 and the epitaxial p-type drain 116 are grown as epitaxial layers. The epitaxial p-type source 114 and the epitaxial p-type drain 116 have a polygonal shape. In some embodiments, the polygonal shape is a hexagon, as shown in FIG. 1B.

Figure 1B:
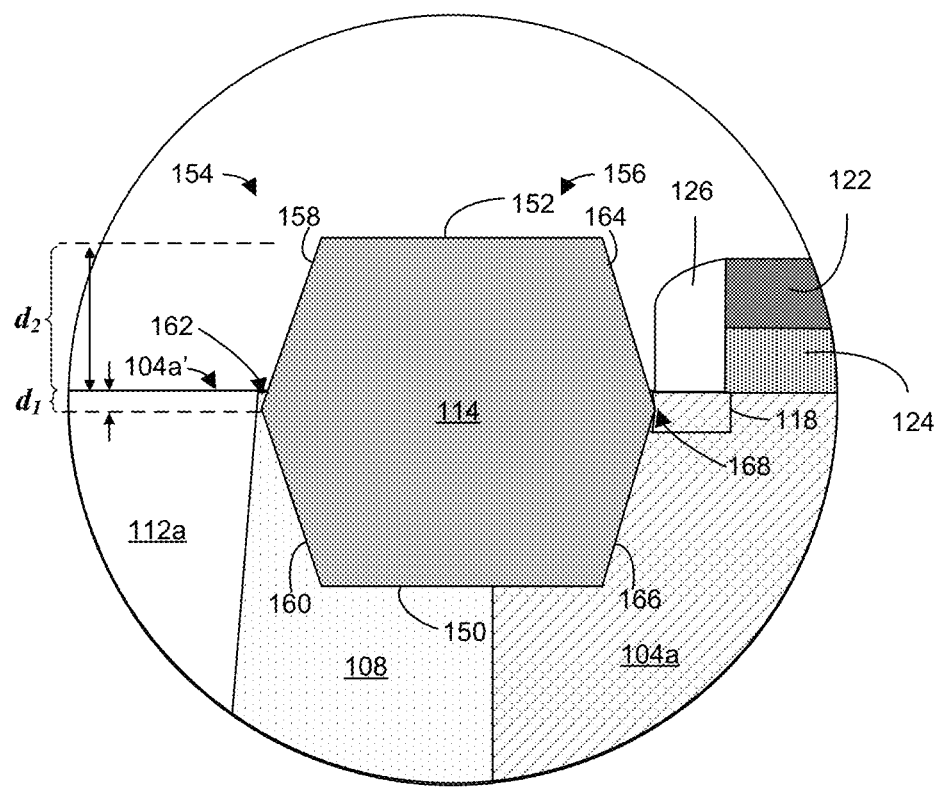
FIG. 1B illustrates a detailed view of an epitaxial source as shown in FIG. 1A.

Turning to FIG. 1B, the polygonal epitaxial p-type source 114 is shown embedded in the first N-well region 104a. The epitaxial p-type source 114 has six substantially planar facets including a bottom facet 150, a top facet 152, a first side 154 having two angled facets, and a second side 156 having two angled facets. The first side 154 has a first upper facet 158 that extends from the top facet 152 into the isolated P-well 108. The first side 154 also has a first lower facet 160 that extends from the bottom facet 150 toward the first upper facet 158. The first upper facet 158 and the first lower facet 160 meet at a first point 162 below an uppermost surface 104a' of the first N-well region 104a by a distance, $d_1$. Because the substrate 102 includes the N-well regions 104, the uppermost surface 104a' of the first N-well region 104a is the uppermost surface of the substrate 102.

The second side 156 has a second upper facet 164 that extends from the top facet 152 into the first N-well region 104a. The second side 156 also has a second lower facet 166 that extends from the bottom facet 150 toward the second upper facet 164. The second upper facet 164 and the second lower facet 166 meet at a second point 168 below an uppermost surface 104a' of the first N-well region 104a by a distance, $d_1$. Accordingly, the epitaxial p-type source 114 may be embedded in the first N-well region 104a such that the first point 162 and the second point 168 are a distance, $d_1$, below uppermost surface 104a'. In some embodiments, the first point 162 may underlie a gate dielectric 124 or a sidewall spacer of the sidewall spacers 126.

A portion of the epitaxial p-type source 114 extends above the uppermost surface 104a' of the first N-well region 104a by a distance, $d_2$. The amount of the epitaxial p-type source 114 that extends above the uppermost surface 104a' may be based on the epitaxial growth process. The distance, $d_2$, may be greater than the distance, $d_1$. In some embodiments, the distance, $d_2$, may be greater than the height other features on the substrate 102. For example, the distance, $d_2$, may be greater than the height of a gate 120. The facets 150, 152, 158, 160, 164, and 166 are substantially smooth due to the epitaxial growth of the epitaxial p-type source 114.

While FIG. 1B shows the epitaxial p-type source 114, the epitaxial p-type drain 116 may have similar, if not the same dimensions. For example, the epitaxial p-type drain 116 may also have angled facets at the side that extend to meet at points underlying the uppermost surface of the P-well region 106. Furthermore, the polygonal shape may be selected for the epitaxial p-type source 114 and/or the epitaxial p-type drain 116 based on the tensile strength of a polygon, however, other shapes may be used.

Returning to FIG. 1A, in some embodiments, the epitaxial p-type source 114 and the epitaxial p-type drain 116 may be a p-type elementary semiconductor including silicon or germanium in a crystalline structure. In other embodiments, the epitaxial p-type source 114 and the epitaxial p-type drain 116 comprise a p-type alloy, such as SiGe, GaAsP, AlInAs, AlGaAs, GaInAs, GaInP, GaInAsP, or and Ge composition change from one ratio at one location to another ratio at another location. The epitaxial p-type source 114 and the epitaxial p-type drain 116 have a doping concentration ranging between about $10^{20}$ and $10^{21}$ impurities/cm$^{-3}$.

A P-type lightly doped diffusion (PLDD) region 118 is disposed in the first N-well region 104a and is aligned with an edge of the gate 120, and resides under spacer 126. The gate 120 is formed on an uppermost surface of the substrate 102 and is laterally interposed between the epitaxial p-type source 114 and the epitaxial p-type drain 116. The gate 120 may extend over the second isolation structure 112b, which is positioned between the epitaxial p-type source 114 and the epitaxial p-type drain 116. The gate 120 includes a gate electrode 122, a gate dielectric 124, and sidewall spacers 126 abutting the sidewalls of the gate electrode 122 and the gate dielectric 124.

The epitaxial p-type source 114, the epitaxial p-type drain 116, and the gate 120 collectively form a PMOS transistor 100. Because the epitaxial p-type source 114 and the epitaxial p-type drain 116 are grown, the epitaxial p-type source 114 and the epitaxial p-type drain 116 do not suffer defects common to sources and drains formed by ion implantation. Furthermore, the epitaxial growth can provide higher doping concentrations for the epitaxial p-type source 114 and the epitaxial p-type drain 116. These advantages have the effect of reducing the RDS(on) of the PMOS transistor 100. Advantageously, the lower RDS(on) facilitates current flow in the PMOS transistor 100, thereby reducing gate burnout and increasing switching speed so that is suitable for high voltage applications.

Figure 2:
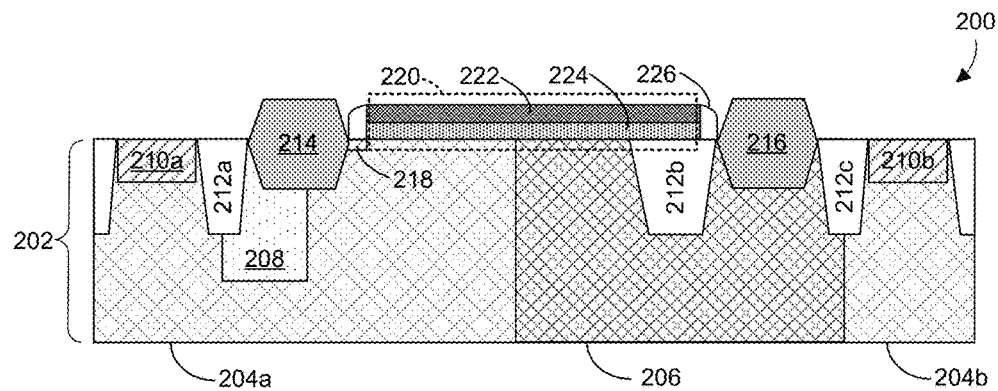
FIG. 2 illustrates a cross-sectional view of some embodiments of an N-type metal oxide semiconductor (NMOS) having an epitaxial source and drain.

With reference to FIG. 2, a cross-sectional view illustrates embodiments of an N-type metal oxide semiconductor (NMOS) transistor 200 having an epitaxial n-type source and drain. The NMOS transistor 200 includes a substrate 202. The substrate 202 has P-well regions including a first P-well region 204a and a second P-well region 204b. In some embodiments, the P-well regions 204a, 204b are high-voltage P-wells (HVPWs), as described above with respect to P-well region 106 of FIG. 1A. The substrate 202 also includes an N-well region 206. The N-well region 206 is arranged between the first P-well region 204a and the second P-well region 204b. In some embodiments, the N-well region 206 is a high-voltage N-well (HVNW), as described above with respect to the N-well regions 104a, 104b of FIG. 1A.

An isolated N-well 208 is implanted in the first P-well region 204a. In some embodiments, the isolated N-well 208 has an N-type dopant and may have a doping concentration ranging between about $10^{16}$ and $10^{18}$ impurities/cm$^{-3}$. The P-well regions 204a, 204b also include P+ doped regions 210a, 210b respectively. For example, a first P+ doped region 210a is implanted in the first P-well region 204a and a second P+ doped region 210b is implanted in the second P-well region 204b. The P+ doped regions 110a, 110b function as a body contacts to the P-well regions 204.

Isolation structures 212a, 212b, 212c may include a first isolation structure 212a, a second isolation structure 212b, and a third isolation structure 212c. The isolation structures 212a, 212b, 212c may be, for example, shallow trench isolation structures, deep trench isolation structures, or some other type of isolation structures. The isolation structures 212a, 212b, 212c extend from a top surface of the substrate 202, as described above with respect to FIG. 1A.

An epitaxial n-type source 214 is disposed in the first P-well region 204a and an epitaxial n-type drain 216 is disposed in the N-well region 206. The epitaxial n-type source 214 and the epitaxial n-type drain 216 are grown as epitaxial layers as described above with n-type materials. For example, here, the epitaxial n-type source 214 and the epitaxial n-type drain 216 comprise an n-type elementary semiconductor including silicon or phosphorus, such as, SiP. Furthermore, the epitaxial n-type source 214 and the epitaxial n-type drain 216 may have a similar, if not the same, polygonal shape, as described above with respect to FIG. 1B.

An N-type lightly doped diffusion region (NLDD) region 218 is disposed in the first P-well region 204a and is aligned with a gate 220. The gate 220 is formed on an uppermost surface of the substrate 202 and is laterally interposed between the epitaxial n-type source 214 and the epitaxial n-type drain 216. The gate 220 may extend over the second isolation structure 212b, which is positioned between the epitaxial n-type source 214 and the epitaxial n-type drain 216. The gate 220 includes a gate dielectric 222, a gate electrode 224, and sidewall spacers 226 butting the sidewalls of the gate dielectric 222 and the gate electrode 224. The epitaxial n-type source 214, the epitaxial n-type drain 216, and the gate 220 collectively form an NMOS transistor 200. Like the PMOS 100 described above, the epitaxial n-type source 214 and the epitaxial n-type drain 216 provide a low RDS(on).

Figure 3:
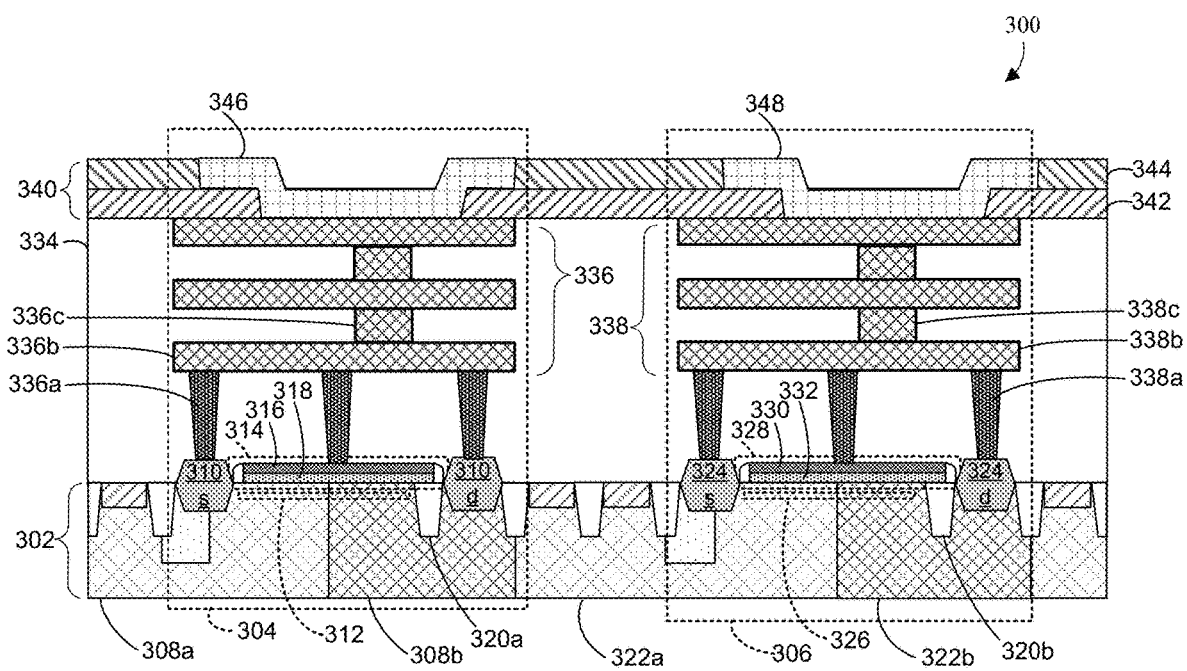
FIG. 3 illustrates a cross-sectional view of some embodiments of an integrated circuit (IC) having epitaxial source and drain for high voltage devices.

With reference to FIG. 3, a cross-sectional view illustrates of some embodiments of an integrated circuit (IC) using epitaxial source and drain structures for high voltage devices. The integrated chip 300 comprises a PMOS device 304 and an NMOS device 306 disposed over a semiconductor substrate 302. The PMOS device 304 includes PMOS well regions 308 disposed within a semiconductor substrate 302. The PMOS well regions 308 include a first PMOS well region 308a and a second PMOS well region 308b. The first PMOS well region 308a has a first doping type and the second PMOS well region 308b has a second doping type that is different from the first doping type. For example, the first PMOS well region 308a may be a HVNW while the second PMOS well region 308b may be HVPW. A PMOS transistor is arranged within the PMOS well regions 308. The PMOS transistor comprises an epitaxial source 310s that is separated from an epitaxial drain 310d by a channel region 312. A gate structure 314 is arranged over the channel region 312. The gate structure 314 comprises a gate electrode 316 separated from the channel region 312 by a gate dielectric layer 318. In some embodiments, an isolation regions 320a (e.g., shallow trench isolation regions) is arranged between the epitaxial source 310s and the epitaxial drain 310d, within the semiconductor substrate 302.

The NMOS device 306 includes NMOS well regions 322 disposed within the semiconductor substrate 302. The NMOS well regions 322 include a first NMOS well region 322a and a second NMOS well region 322b. The first NMOS well region 322a has a first doping type and the second NMOS well region 322b has a second doping type that is different from the first doping type. For example, the first NMOS well region 322a may be a HVPW while the second NMOS well region 322b may be HVNW. An NMOS transistor is arranged within the NMOS well regions 322. The NMOS transistor comprises an epitaxial source 324s that is separated from an epitaxial drain 324d by a channel region 326. A gate structure 328 is arranged over the channel region 326. The gate structure 328 comprises a gate electrode 330 separated from the channel region 326 by a gate dielectric layer 332. In some embodiments, an isolation region 320b (e.g., shallow trench isolation regions) the epitaxial source 324s and the epitaxial drain 324d within the semiconductor substrate 302.

An Inter-Layer Dielectric (ILD) structure 334 is arranged over the semiconductor substrate 302. In some embodiments, the ILD structure 334 may comprise one or more layers of an oxide, a low-k dielectric, or an ultra-low-k dielectric. A first set of interconnect layers 336 including contacts 336a, metal wire layers 336b, and metal via layers 336c are surrounded by the ILD structure 334 and overlie the PMOS device 304. A second set of interconnect layers 338 including contacts 338a, metal wire layers 338b, and metal via layers 338c are surrounded by the ILD structure 334 and overly the NMOS device 306. In some embodiments, first set of interconnect layers 336 and the second set of interconnect layers 338 may comprise copper, tungsten, and/or aluminum. The ILD structure 334 is capped by a capping structure 340. The capping structure 340 may include a plurality of passivation layers, for example, a first passivation layer 342 and a second passivation layer 344. The first passivation layer 342 and the second passivation layer 344 may comprise materials that are oxides or nitrides (e.g., silicon oxide, silicon nitride), undoped silicate glass, and/or multi-layer thereof. Bond pads, including a first bond pad 346 and a second bond pad 348, are seated in the capping structure 340. The first bond pad 346 and the second bond pad 348 are comprised of a conductive material, such as copper. In some embodiments, the first bond pad 346 is connected to the PMOS device 304 through the first set of interconnect layers 336 and the second bond pad 348 is connected to the NMOS device 306 through the second set of interconnect layers 338.

With reference to FIGS. 4-13, a series of cross-sectional views 400-1300 illustrate some embodiments of a method for manufacturing an IC with an epitaxial source and an epitaxial drain for a PMOS transistor, like the PMOS transistor of FIG. 1A.

Figure 4:
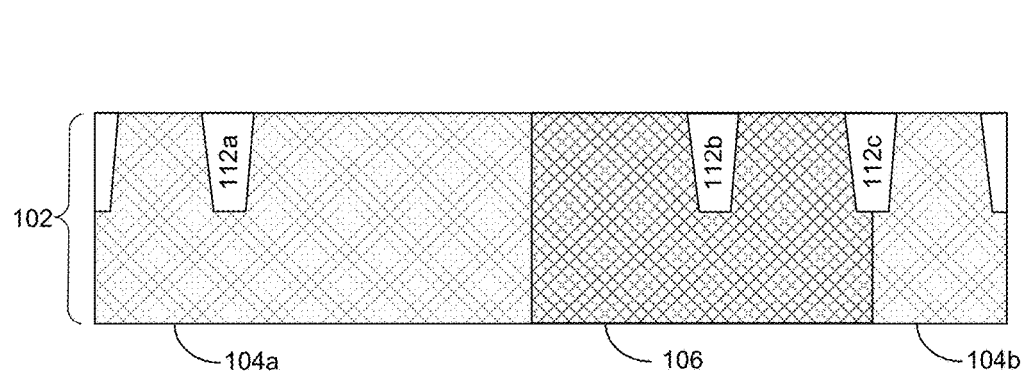
FIGS. 4-13 illustrate a series of cross-sectional views of some embodiments of a method for manufacturing an IC having an epitaxial source and drain.

As illustrated by the cross-sectional view 400 of FIG. 4, a substrate 102 is provided. The substrate 102 can be made of a semiconductor material. In some embodiments, the substrate 102 is a bulk monocrystalline silicon substrate, while in other embodiments the substrate is a semiconductor or insulator (SOI) substrate, comprising a handle substrate, an insulating layer over the handle substrate, and a device layer made of semiconductor material over the insulating layer. Isolation structures 112a, 112b, and 112c are formed in the substrate, and extend into the top surface of the substrate 102. The substrate 102 may have a thickness ranging between about 1.5 micrometers and 4 micrometers. For example, the substrate 102 may be about 2.5 micrometers thick. The isolation structures 112a, 112b, 112c extend from a top surface of the substrate 102 and may, for example have a depth of approximately 1 micrometer. The isolation structures 112a, 112b, 112c demarcate device regions of the substrate 102, such as a logic region or high-voltage device region. In some embodiments, a process for forming the isolation structures 112a, 112b, 112c comprises forming trenches, and subsequently filling the trenches with a dielectric material.

The substrate is implanted with dopants to form N-well regions 104a, 104b and a P-well region 106. As described above, the N-well regions 104a, 104b have an N-type dopant and may have a doping concentration ranging between about $10^{15}$ and $10^{17}$ impurities/cm$^{-3}$ and the P-well region 106 has a P-type dopant and may have a doping concentration ranging between about $10^{15}$ and $10^{17}$ impurities/cm$^{-3}$. The N-well regions 104a, 104b may have a thickness ranging between about 2 micrometers and 5 micrometers.

Figure 5:
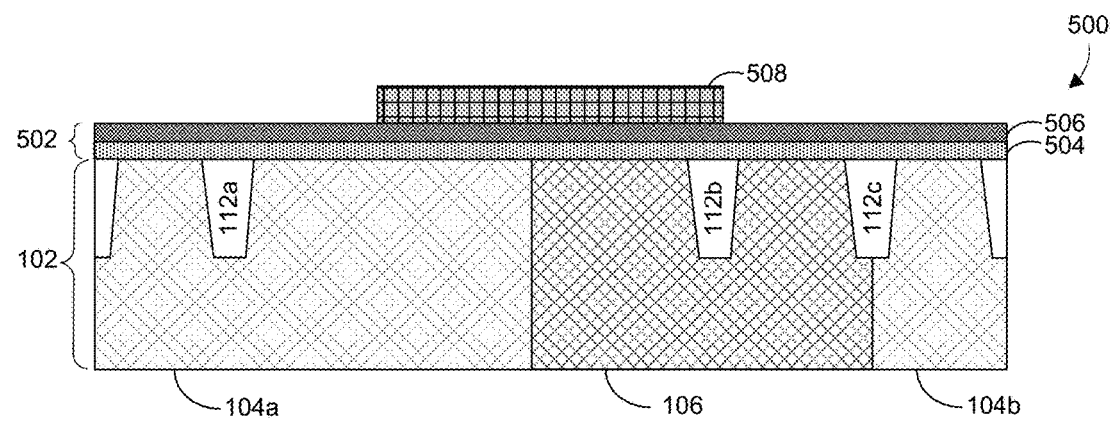

As illustrated by the cross-sectional view 500 of FIG. 5, a plurality of gate layers 502 is formed over the substrate 102. In some embodiments, the plurality of gate layers 502 includes a gate dielectric layer 504 and a gate electrode layer 506. The gate dielectric layer 504, for example, can comprise a high-k dielectric, and the gate electrode layer 506 can comprise polysilicon in some embodiments. While the gate dielectric layer 504 and the gate electrode layer 506 are each shown as shown as a single layer, each layer may be comprised of multiple layers. A gate mask 508 is selectively deposited over the plurality of gate layers 502. In particular, the gate mask 508 is formed and patterned to lie between the first isolation structure 112a and the second isolation structure 112b. In some embodiments, the gate mask 508 is a photoresist layer.

Figure 6:
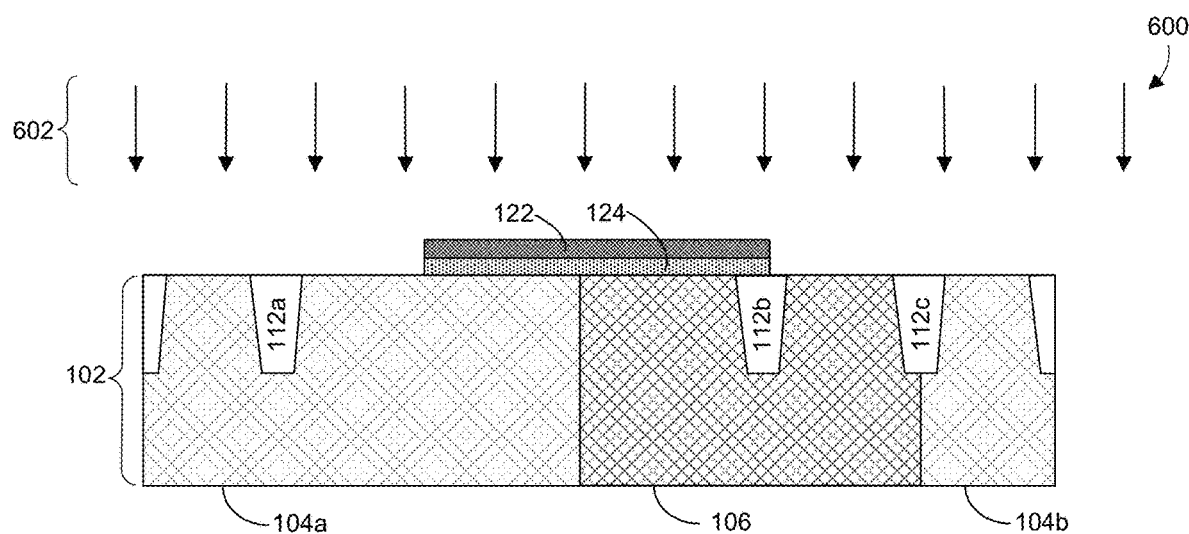

As illustrated by the cross-sectional view 600 of FIG. 6, the plurality of gate layers 502 is patterned with the gate mask (508 of FIG. 5) in place. For example, the first patterning 602 may be performed using photolithography to pattern the plurality of gate layers (502 of FIG. 5). Alternatively, the first patterning 602 may occur by exposing the gate layers (502 of FIG. 5) to an etchant. In another embodiment, the first patterning 602 may be performed by etching the plurality of gate layers (502 of FIG. 5) with an etchant. The etchant may comprise a dry etchant having an etching chemistry comprising a fluorine species (e.g., $CF_4$, $CHF_3$, $C_4F_8$, etc.) or a wet etchant comprising hydrofluoric acid (HF). Subsequently, the gate mask (508 of FIG. 5) is stripped resulting in the gate electrode 122 and the gate dielectric 124.

Figure 7:
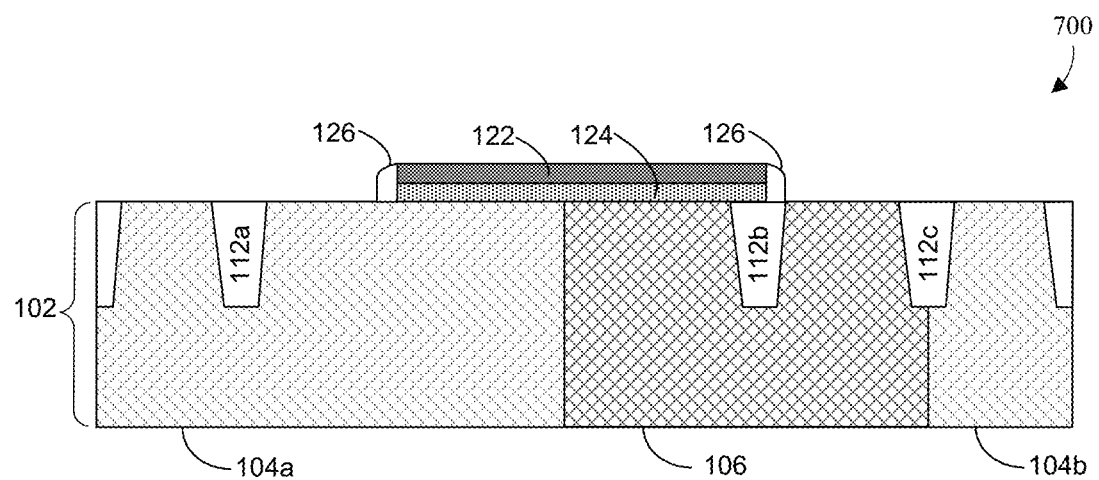

As illustrated by the cross-sectional view 700 of FIG. 7, the sidewall spacers 126 are formed along sidewalls the gate electrode 122 and the gate dielectric 124 to form the gate 120. The sidewall spacers 126 may, for example, be oxide or some other dielectric, such as silicon nitride. In some embodiments, a process for forming the sidewall spacers 126 comprises forming gate spacer layer conformally covering and lining the gate electrode 122 and the gate dielectric 124, respectively. The gate spacer layer may, for example, be formed by high temperature oxidation (HTO), which may, for example, be followed by rapid thermal annealing (RTA). Further, in some embodiments, the process comprises performing an etch back in to the gate spacer layer to remove horizontal segments of the gate spacer layer without removing vertical segments of the gate spacer layer. The vertical segments which remain in place after the etch back correspond to the sidewall spacers 126.

Figure 8:
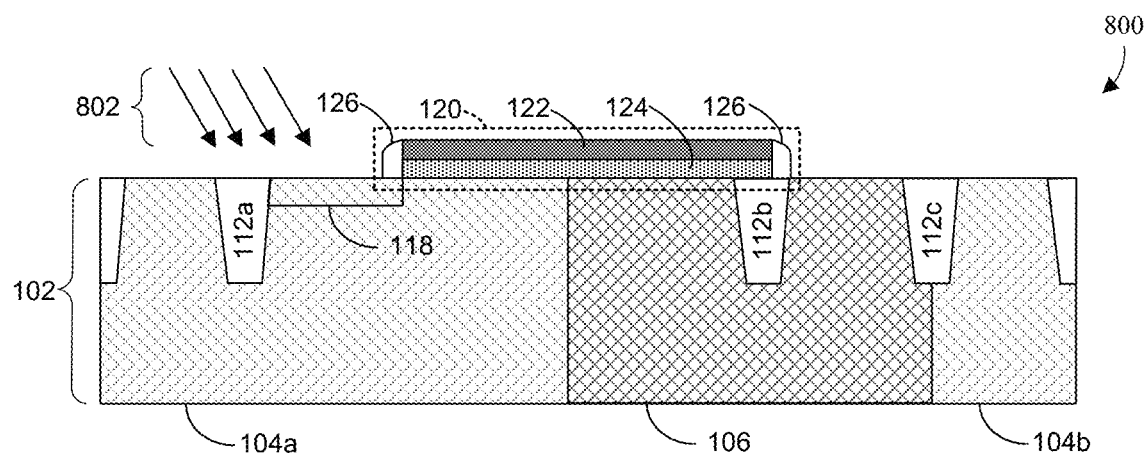

As illustrated by the cross-sectional view 800 of FIG. 8, an angled implant 802 is performed to form a PLDD region 118 under the gate 120 in the first N-well region 104a. The angled implant 802 has a different conductivity type (e.g., p+) than the first N-well region 104a. In some embodiments the angled implant 802 can be implanted in other exposed surface regions of the substrate including 104a, 104b, and 106 (not shown), but the angled implant 802 can also be blocked from these other surface regions by a field oxide or other blocking structure (not shown), and because of this only a PLDD region 118 is illustrated.

Figure 9:
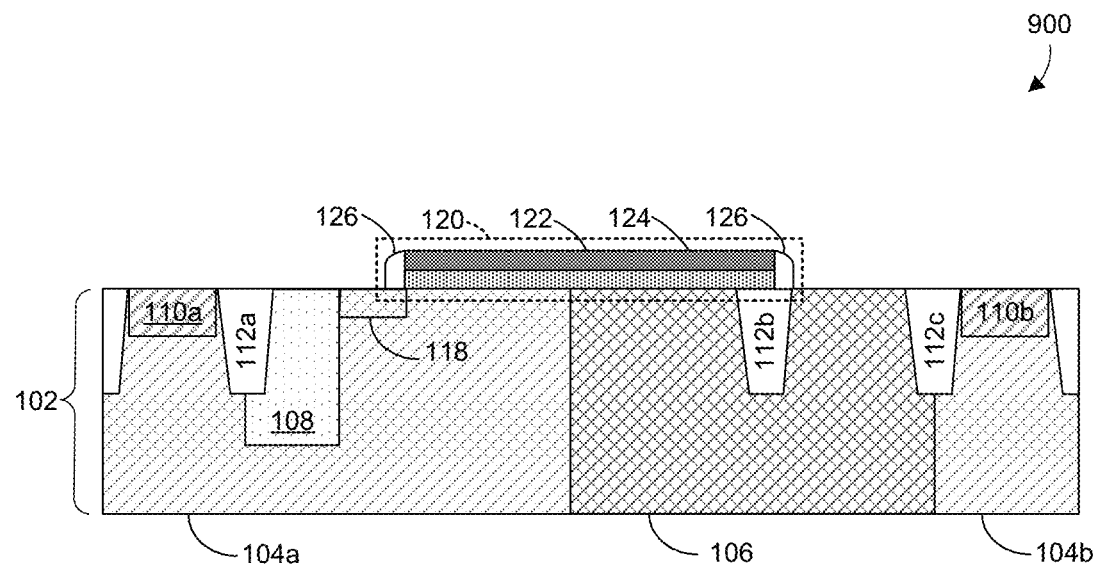

As illustrated by the cross-sectional view 900 of FIG. 9, a normal p-type ion implantation operation is performed with a p-well mask (not shown) in place to form an isolated P-well 108 (with "normal" meaning perpendicular to the surface of the substrate 102). A separate normal n-type ion implantation operation is performed with an n-well mask in place to form a first N+ doped region 110a in the first N-well region 104a and to concurrently form a second N+ doped region 110b in the second N-well region 104b. The isolated P-well 108 may have a thickness ranging between about 0.5 micrometers and 2 micrometers. In another example, the thickness of the isolated P-well 108 may range between about 1 micrometers and 1.5 micrometers.

Figure 10:
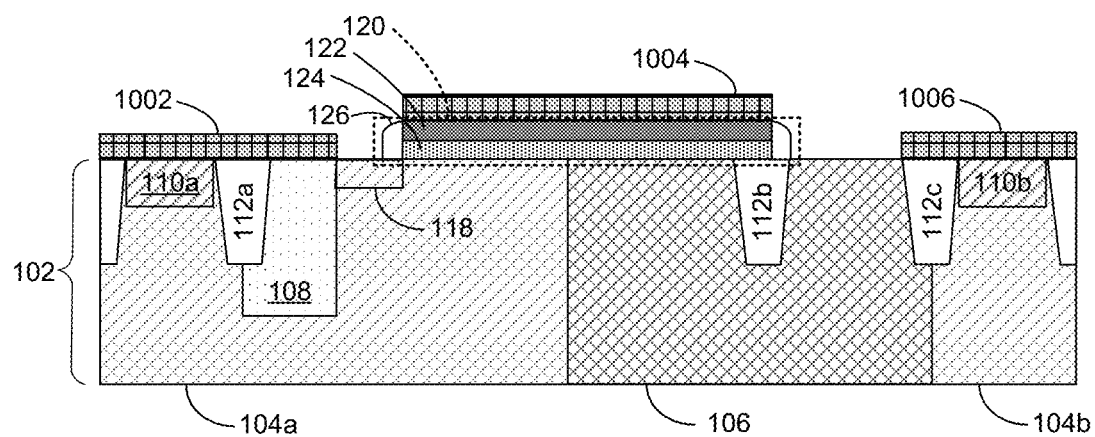

As illustrated by the cross-sectional view 1000 of FIG. 10, hard mask layers 1002-1006 are deposited. The hard mask layers 1002 and 1006 are selectively deposited over substrate 102 and the hard mask layer 1004 is deposited over the gate 120. The hard mask layers 1002-1006 may be comprised of silicon nitride (S3Ni4).

Figure 11:
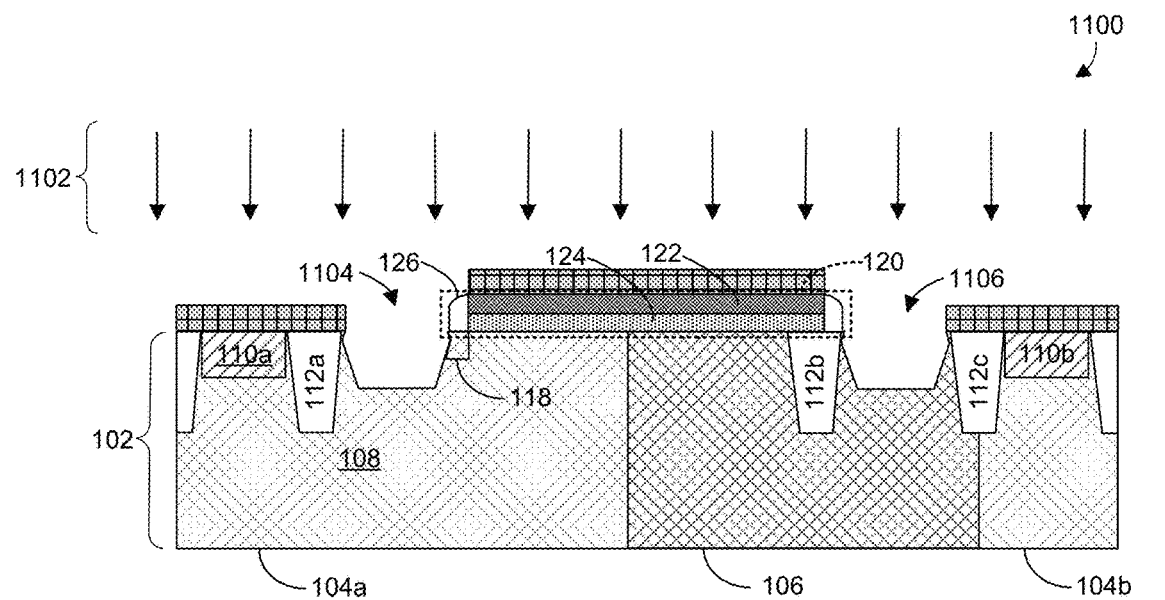

As illustrated by the cross-sectional view 1100 of FIG. 11, a second patterning 1102 etches the uppermost surface of the substrate 102 to form a multi-edged source cavity 1104 and a multi-edged drain cavity 1106. In some embodiments the second patterning 1102 is an angled etch that allows the cavity to extend at angles into the substrate 102. The multi-edged source cavity 1104 and the multi-edged drain cavity 1106 have a plurality of substantially planar edges connected at corners. An etchant of the second patterning 1102 may comprise a dry etchant having an etching chemistry such as a fluorine species (e.g., $CF_4$, $CHF_3$, $C_4F_8$, etc.) or a wet etchant such as hydrofluoric acid (HF).

Figure 12:
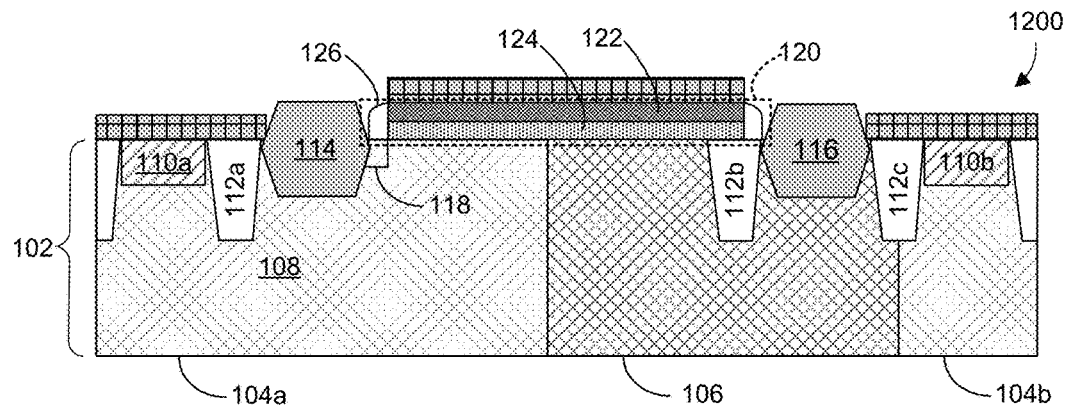

As illustrated the cross-sectional view 1200 of FIG. 12, an epitaxial p-type source 114 and epitaxial p-type drain 116 are formed by an epitaxial growth process. The epitaxial p-type source 114 is formed in the multi-edged source cavity (1104 of FIG. 11) and the epitaxial p-type drain 116 is formed in the multi-edged drain cavity (1106 of FIG. 11). The epitaxial p-type source 114 and the epitaxial p-type drain 116 are grown using epitaxial techniques. Suppose that the epitaxial p-type source 114 is silicon germanium (SiGe). Deposition of the doped silicon germanium may be carried out in a CVD reactor, an LPCVD reactor, or an ultra-high vacuum CVD (UHVCVD). The reactor temperature may fall between 600° C. and 800° C. and the reactor pressure may fall between 1 and 760 Torr. The carrier gas may consist of hydrogen or helium at a flow rate that ranges between 10 and 50 SLM.

The deposition may be carried out using a silicon source precursor gas such as dichlorosilane (DCS or $SiH_2Cl_2$), silane ($SiH_4$), or disilane ($Si_2H_6$). For instance, DCS may be used at a flow rate that ranges between 15 and 100 SCCM. The deposition may also use a germanium source precursor gas such as $GeH_4$ that is diluted in $H_2$ (e.g., the $GeH_4$ may be diluted at 1-5%). For instance, the diluted $GeH_4$ may be used at a 1% concentration and at a flow rate that ranges between 50 and 300 SCCM. Accordingly, a SiGe epitaxial p-type source 114 can then be grown.

Here, the method for manufacturing an IC with an epitaxial source and drain is described for a PMOS transistor, like the PMOS transistor of FIG. 1A. Accordingly, the epitaxial p-type drain 116 may also be SiGe. Thus, the epitaxial p-type drain 116 is grown using a similar epitaxial growth process. However, the method for manufacturing an IC with an epitaxial source and drain may also be used for a NMOS transistor, like the NMOS transistor of FIG. 2. The epitaxial n-type source 214 and the epitaxial n-type drain 216 may be comprised of silicon phosphide (SiP). For example, rather than using a germanium source precursor gas, a phosphorous source precursor gas may be used to form the epitaxial n-type source 214 and the epitaxial n-type drain 216. The epitaxial growth process may cause the epitaxial p-type source 114 and the epitaxial p-type drain 116 to grow over the uppermost surface of the substrate 102.

Figure 13:
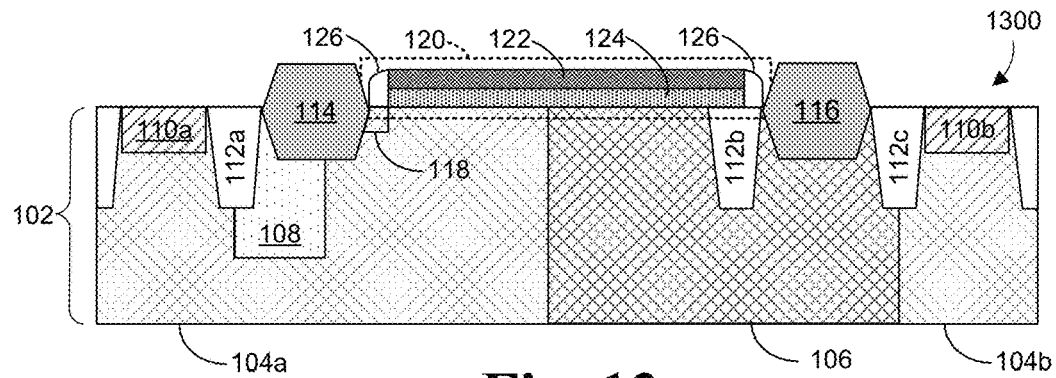

As illustrated the cross-sectional view 1300 of FIG. 13, once the epitaxial p-type source 114 and the epitaxial p-type drain 116 are grown, the hard mask layers 1002-1006 are removed from the substrate 102 and the gate 120. For example, in some embodiments, removing the hard mask layers 1002-1006 may reduce a thickness of the epitaxial p-type source 114 and the epitaxial p-type drain 116 over the substrate 102 by a range of between approximately 1% and approximately 10% (e.g., from approximately 10 angstroms to approximately 9 angstroms). In other embodiments, removing the hard mask layers 1002-1006 may reduce a thickness of the epitaxial p-type source 114 and the epitaxial p-type drain 116 to be at or below the surface of the substrate 102.

While FIGS. 4-13 describe the method of manufacture for a PMOS device having an epitaxial p-type source and epitaxial p-type drain, the method can be adapted to an NMOS device by altering the doping characteristics of the device. For example, an NMOS device would have an epitaxial n-type source and epitaxial n-type drain. Accordingly, the method would not change, but rather the dopants would change to be suitable for the type of device.

Figure 14:
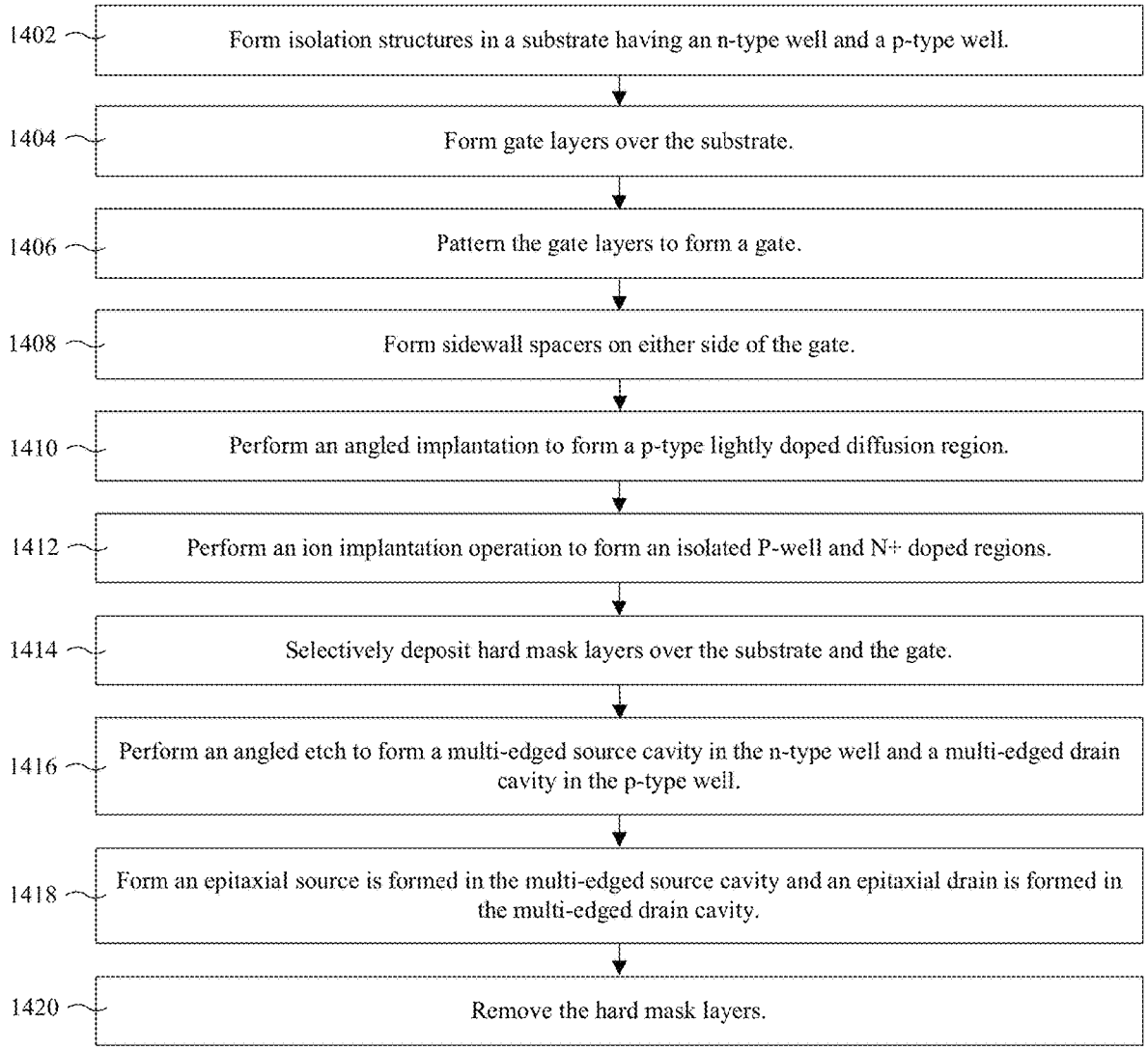
FIG. 14 illustrates a flowchart of some embodiments of the method of FIGS. 4-13.

With reference to FIG. 14, a flowchart 1400 of some embodiments of the method of FIGS. 4-13 is provided.

At 1402, isolation structures are formed in a substrate. The substrate includes an n-type well and a p-type well. The n-type well may be a high-voltage n-type well (HVNW) and the p-type well may be a high-voltage p-type well (HVPW). The isolation structures extend into the interior of the substrate from top surface of the substrate. See, for example, FIG. 4.

At 1404, gate layers are formed over the substrate. The gate layers may include a gate dielectric layer and a gate electrode layer. Further, a gate mask is deposited over the gate layers. See, for example, FIG. 5.

At 1406, a gate is formed by patterning the gate layers. The gate includes a gate dielectric and a gate electrode. See, for example, FIG. 6.

At 1408, sidewall spacers are formed on either side of the gate. See, for example, FIG. 7.

At 1410, a PLDD region is formed under the gate in the N-type well by an angled implantation. In some embodiments, an edge of the PLDD region is aligned with the gate. See, for example, FIG. 8.

At 1412, an isolated P-well and a first N+ doped region are formed in the first N-type well and an N+ doped region is formed in the second N-well region by an ion implantation operation. See, for example, FIG. 9.

At 1414, hard mask layers and are selectively deposited over substrate and the gate. See, for example, FIG. 10.

At 1416, a multi-edged source cavity in the n-type well and a multi-edged drain cavity in the p-type well of the substrate. See, for example, FIG. 11.

At 1418, an epitaxial p-type source is formed in the multi-edged source cavity and an epitaxial p-type drain is formed in the multi-edged drain cavity. See, for example, FIG. 12.

At 1420, the hard mask layers are removed. See, for example, FIG. 13.

Advantageously, the epitaxial p-type source and the epitaxial p-type drain lower the RDS(on).

While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide an integrated circuit having an epitaxial source and drain, which reduces gate burnout and increases switching speed so that is suitable for high voltage applications. The integrated circuit includes a semiconductor substrate having a high voltage N-well (HVNW) and a high voltage P-well (HVPW). The integrated circuit further includes a high-voltage device on the semiconductor substrate. The high-voltage device includes an epitaxial p-type source disposed in the HVNW, an epitaxial p-type drain disposed in the HVPW, and a gate arranged between the epitaxial p-type source and the epitaxial p-type drain on a surface of the semiconductor substrate.

Further, other embodiments of the present application provide an integrated circuit having an epitaxial source and drain. The integrated circuit includes a semiconductor substrate having a high voltage P-well (HVPW) and a high voltage N-well (HVNW). The integrated circuit also includes a high-voltage device on the semiconductor substrate. The high-voltage device has an epitaxial n-type source disposed in the HVPW, an epitaxial n-type drain disposed in the HVNW, and a gate arranged between the HVPW and the HVNW on a surface of the semiconductor substrate.

Further yet, other embodiments of the present application provide a method for manufacturing an integrated circuit (IC) having an epitaxial source and drain. The method includes forming gate layers over a substrate. The substrate has a high voltage n-well (HVNW) and a high-voltage p-well (HVPW). The gate layers are patterned to form a gate having a gate dielectric and a gate electrode. Sidewall spacers are formed on either side of the gate dielectric and the gate electrode. The method also includes selectively depositing hard mask layers over the substrate and the gate. An angled etch is performed to form a multi-edged source cavity in the HVNW and a multi-edged drain cavity in the HVPW. The multi-edged source cavity and the multi-edged drain cavity have a plurality of substantially planar edges connected at corners. An epitaxial p-type source is formed in the multi-edged source cavity and an epitaxial p-type drain is formed in the multi-edged drain cavity. The epitaxial p-type source and the epitaxial p-type drain have a polygonal shape. The hard mask layers are then removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a semiconductor substrate having a high voltage N-well (HVNW) and a high voltage P-well (HVPW); and
a high-voltage device on the semiconductor substrate, wherein the high-voltage device comprises an epitaxial p-type source disposed in the HVNW, an epitaxial p-type drain disposed in the HVPW, and a gate arranged between the epitaxial p-type source and the epitaxial p-type drain on a surface of the semiconductor substrate;
wherein the epitaxial p-type source has six substantially planar facets including a bottom facet, a top facet, a first side having two angled facets, and a second side having two angled facets; and
wherein a first side of the epitaxial p-type source includes:
a first upper facet that extends from the top facet into the HVNW; and
a first lower facet that extends from the bottom facet toward the first upper facet, wherein the first upper facet and the first lower facet meet at a first point.

2. The IC according to claim 1, wherein the epitaxial p-type source and the epitaxial p-type drain are silicon germanium (SiGe).

3. The IC according to claim 1, wherein the epitaxial p-type source and the epitaxial p-type drain have a polygonal shape.

4. The IC according to claim 3, wherein the polygonal shape is hexagonal.

5. The IC according to claim 1, wherein the first point is below the surface of the semiconductor substrate.

6. The IC according to claim 5, wherein the second side includes
a second upper facet that extends from the top facet into the HVPW; and
a second lower facet that extends from the bottom facet toward the second upper facet, wherein the second upper facet and the second lower facet meet at a second point below the surface of the semiconductor substrate, and wherein the first point and the second point extend a distance, $d_1$, under the surface of the semiconductor substrate.

7. The IC according to claim 5, wherein the gate includes a gate dielectric, a gate electrode, and sidewall spacers separated by the gate dielectric and the gate electrode, and wherein the first point underlies a sidewall spacer of the sidewall spacers.

8. The IC according to claim 1, wherein a portion of the epitaxial p-type source extends above the surface of the semiconductor substrate.

9. The IC according to claim 1, further comprising:
a first doped region laterally offset from the epitaxial p-type source on a side of the epitaxial p-type source opposite the gate;
a second doped region laterally offset from the epitaxial p-type drain on a side of the epitaxial p-type drain opposite the gate; and
wherein a top surface of the first doped region and a top surface of the second doped region are aligned with the top surface of the semiconductor substrate, wherein a bottom surface of the epitaxial p-type source and a bottom surface of the epitaxial p-type drain are below a bottom surface of the first doped region and a bottom surface of the second doped region.

10. An integrated circuit (IC) comprising:
a semiconductor substrate having a high voltage P-well (HVPW) and a high voltage N-well (HVNW);
a high-voltage device on the semiconductor substrate, wherein the high-voltage device comprises an epitaxial p-type source disposed in the HVNW, an epitaxial p-type drain disposed in the HVPW, and a gate arranged between the HVPW and the HVNW on a surface of the semiconductor substrate;
an isolation p-well disposed partially under the epitaxial p-type source on a side of the epitaxial p-type source opposite the epitaxial p-type drain;
a trench isolation structure comprising a dielectric material extending into the semiconductor substrate and surrounding the gate; and
wherein the isolation p-well extends partially under the epitaxial p-type source and partially under the trench isolation structure and has a depth into the semiconductor substrate that is greater than that of the trench isolation structure.

11. The IC according to claim 10, wherein the epitaxial p-type source and the epitaxial p-type drain are silicon germanium (SiGe).

12. The IC according to claim 10, wherein the epitaxial p-type source and the epitaxial p-type drain have a polygonal shape.

13. The IC according to claim 12, wherein the polygonal shape is hexagonal.

14. The IC according to claim 10, wherein the epitaxial p-type source has six substantially planar facets including a bottom facet, a top facet, a first side having two angled facets, and a second side having two angled facets.

15. The IC according to claim 14, wherein the first side includes
a first upper facet that extends from the top facet into the HVNW; and
a first lower facet that extends from the bottom facet toward the first upper facet, wherein the first upper facet and the first lower facet meet at a first point below an uppermost surface HVNW.

16. The IC according to claim 15, wherein the gate includes a gate dielectric, a gate electrode, and sidewall spacers separated by the gate dielectric and the gate electrode, and wherein the first point underlies a sidewall spacer of the sidewall spacers.

17. The IC according to claim 10, wherein a portion of the epitaxial p-type source extends above an uppermost surface of the HVNW.

18. An integrated circuit (IC) comprising:
a semiconductor substrate having a first high voltage well comprising a first dopant and a second high voltage well comprising a second dopant, wherein the first dopant is opposite the second dopant; and
a high-voltage device on the semiconductor substrate, wherein the high-voltage device comprises an epitaxial source disposed in the first high voltage well, wherein the epitaxial source comprises the second dopant, an epitaxial drain disposed in the second high voltage well, wherein the epitaxial drain comprises the second dopant, wherein a top surface of the epitaxial source and a top surface of the epitaxial drain extend above a top surface of the semiconductor substrate, a gate arranged between the first high voltage well and the second high voltage well on a surface of the semiconductor substrate, and wherein the top surface of the epitaxial source and the top surface of the epitaxial drain are above a top surface of the gate;

a first doped region laterally offset from the epitaxial source on a side of the epitaxial source opposite the gate, wherein the first doped region comprises the first dopant;

a second doped region laterally offset from the epitaxial drain on a side of the epitaxial drain opposite the gate, wherein the second doped region comprises the first dopant; and wherein a top surface of the first doped region and a top surface of the second doped region are aligned with the top surface of the semiconductor substrate, wherein a bottom surface of the epitaxial source and a bottom surface of the epitaxial drain are below a bottom surface of the first doped region and a bottom surface of the second doped region.

19. The IC according to claim 18, wherein the first dopant is p-type and the second dopant is n-type.

20. The IC according to claim 18, wherein the first dopant is n-type and the second dopant is p-type.

\* \* \* \* \*